United States Patent
Naka

(10) Patent No.: US 6,714,908 B1
(45) Date of Patent: Mar. 30, 2004

(54) MODIFIED CONCEALING DEVICE AND METHOD FOR A SPEECH DECODER

(75) Inventor: Nobuhiko Naka, Kanagawa (JP)

(73) Assignee: NTT Mobile Communications Network, Inc., Tokyo (JP)

( * ) Notice: Subject to any disclaimer, the term of this patent is extended or adjusted under 35 U.S.C. 154(b) by 0 days.

(21) Appl. No.: 09/462,126

(22) PCT Filed: May 27, 1999

(86) PCT No.: PCT/JP99/02801

§ 371 (c)(1),
(2), (4) Date: Dec. 29, 1999

(87) PCT Pub. No.: WO99/62055

PCT Pub. Date: Dec. 2, 1999

(30) Foreign Application Priority Data

May 27, 1998 (JP) .......................................... 10-146194

(51) Int. Cl.[7] .............................................. G10L 21/02
(52) U.S. Cl. ...................... 704/228; 704/223; 341/94; 340/825
(58) Field of Search .................... 704/228, 208, 704/214, 223; 341/94; 340/825

(56) References Cited

U.S. PATENT DOCUMENTS

| | | | | |
|---|---|---|---|---|
| 4,178,549 A | * | 12/1979 | Ledenbach et al. ..... | 340/825.69 |
| 5,664,055 A | * | 9/1997 | Kroon ........................ | 704/208 |
| 5,699,485 A | * | 12/1997 | Shoham ...................... | 341/94 |
| 5,732,389 A | * | 3/1998 | Kroon et al. ................ | 704/214 |
| 6,085,158 A | * | 7/2000 | Naka et al. .................. | 704/228 |

FOREIGN PATENT DOCUMENTS

| | | |
|---|---|---|
| JP | 05-113798 A | 5/1993 |
| JP | 09-101800 A | 4/1997 |
| JP | 09-134198 A | 5/1997 |

OTHER PUBLICATIONS

IEEE Transactions on Speech and Audio Processing, vol. 6, No. 2, Mar. 1998, Red Salami et al., "Design and Description of CS–ACELP: A Toll Quality 8 kb/s Speech Coder", pp. 116–130.

* cited by examiner

*Primary Examiner*—Richemond Dorvil
*Assistant Examiner*—Qi Han
(74) *Attorney, Agent, or Firm*—Brinks Hofer Gilson & Lione

(57) ABSTRACT

A speech decoder 10 comprises a decoding processing portion 11 and an amplification process control portion 12. Here, the decoding processing potion 11 is a device for decoding a received coded speech signal (bitstream) BS and outputting a decoded speech signal SP. Additionally, the amplification process control portion 12 monitors the state of occurrence of frame errors in the coded speech signal BS, and when the number of successive frame errors exceeds a predetermined reference frame error number, outputs amplification instructions for a predetermined number of frames after the successive frame errors disappear. As a result, instead of codebook data DCB obtained by a decoding process of the decoding processing portion 11, amplified codebook data DACB are supplied to a synthesis filter portion 17, and is written into the codebook decoder 18 of the decoding processing portion 11 as new original codebook data DCBO. Therefore, after successive frame errors, it is possible to decode normally input coded speech signals BS at a power close to the originally intended power, thus enabling the subjective sound quality of the decoded speech SP to be improved.

3 Claims, 3 Drawing Sheets

MODIFIED CONCEALING DEVICE AND METHOD FOR A SPEECH DECODER

This application is a 371 of PCT/JP02801 May 27, 1999.

TECHNICAL FIELD

The present invention relates to a speech decoder and speech decoding method used in speech CODECs.

BACKGROUND ART

CELP (Code Excited Linear Prediction) has received some attention as a speech coding method.

This CELP is a type of predictive coding wherein samples of the present speech signal are predicted from past decoded results, and the prediction errors which are the differences between the predicted values for the speech signal samples and the actual sample values are coded and sent. Then, in this CELP, a vector quantization is carried out on the prediction errors using with noise sequences and the quantized results are transmitted.

In the decoders for receiving decoding the coded speech signals obtained by a predictive coding method such as CELP and for decoding the received signals, excited signals are generated from the coded speech signals and the internal state of the decoder every standard frame period. Speech signals are decoded from these excited signals, and the internal state can be renewed by these excited signals. Here, when code errors are detected from the frames of the coded speech signals, a concealment process of attenuating the excited signals is performed. This concealment process is explained, for example, in R. Salam et al., "Design and Description of CS-ACELP: A Toll Quality p8 kb/s Speed Coder", IEEE Trans. on Speech and Audio Processing, vol. 6, no. 2, March 1998.

This concealment process prevents the generation of unpleasant distortions due to frame errors.

However, when coding errors occur in the received frames for a plurality of frames in succession and this concealment process is repeated, the internal state of the decoder will become approximately equal to zero. Thus, subsequently, even if the successive frame errors end, a long time is required in order for correctly received coded speech signals to be decoded at the correct power.

DISCLOSURE OF THE INVENTION

The present invention has been accomplished in consideration of the above situation, and has the object of offering a speech decoder and a speech decoding method in which even when the coded speech signal has successive errors, it is possible to return to a state in which decoding is possible at the originally intended power within an early time upon the coded speech signals being input normally once again.

In order to achieve this object, the present invention provides a speech decoder which receives frames of predictively coded speech signals, generates excited signals from said coded speech signals and an internal state, generates decoded speech signals based on these excited signals while renewing the internal state, and performs a concealment process for attenuating the excited signals when code errors are detected from the frames; the speech decoder comprising amplification control means for, when successive frame errors exceeding a predetermined standard frame error number occur, outputting amplification instruction signals during a predetermined time after the successive frame errors have disappeared, and amplification means for amplifying the excited signals while the amplification instruction signals are being outputted.

According to the present invention, when continuous frame errors occur, and the frame errors subsequently disappear, the internal state of the decoder can rapidly be returned to the state prior to the frame errors to allow decoding at the originally intended power, thus allowing degradations in the subjective speech quality after restoration from the frame errors to be reduced.

BEST MODES FOR CARRYING OUT THE INVENTION

A preferable embodiment of the present invention shall be described with reference to the following drawings.

A. Structure of Embodiment

Figure 1:
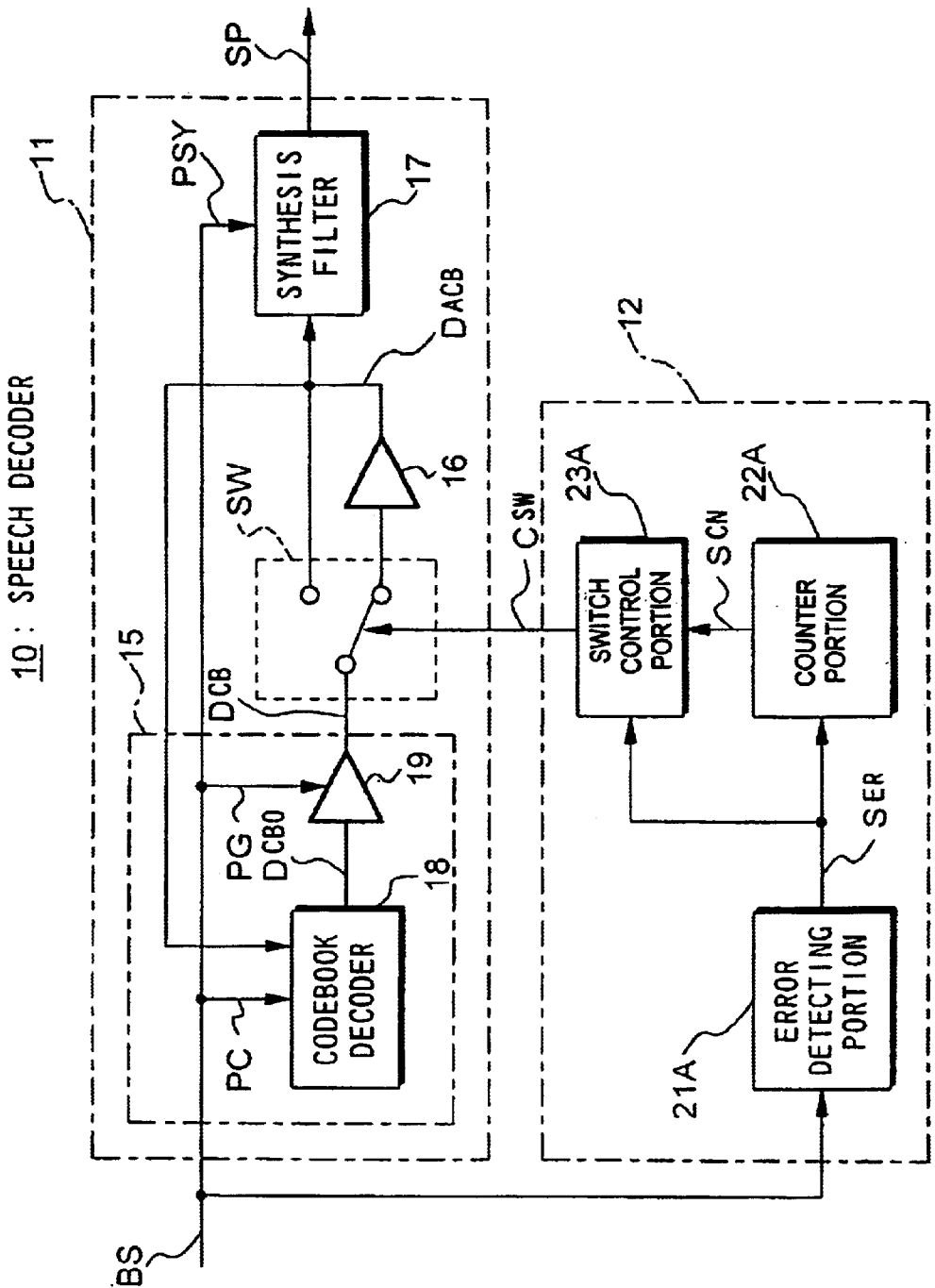
FIG. 1 is a block diagram showing the structure of a speech decoder according to an embodiment of the present invention.

FIG. 1 is a block diagram showing the structure of a speech decoder 10 which is an embodiment of the present invention.

This speech decoder 10 comprises a decoding processing portion 11 and an amplification process control portion 12.

Here, the decoding processing portion 11 is a device for decoding received coded speech signals (Bit Stream) BS and outputting decoded speech signals. Additionally, the coded speech signals BS include a codebook parameter PC, a gain parameter PG and a synthesis parameter PSY The amplification control portion 12 is a device which monitors the state of generation of frame errors of the coded speech signals BS, and when successive frame errors exceeding the predetermined standard frame error number occur, outputs a switch control signal CSW (amplification instruction signal) for a predetermined number of frames after the successive frame errors have disappeared. The purpose of outputting this switch control signal CSW and the process performed according to this switch control signal CSW will be described below.

Next, the structures of the decoding processing portion 11 and the amplification process control portion 12 shall be described.

First, the decoding processing portion 11 comprises a codebook data generating portion 15, an amplifier 16, a synthesis filter 17 and a switch SW.

Here, the codebook data generating portion 15 comprises a codebook decoder 18 and a preamplifier 19.

Of these, the codebook decoder 18 has a rewritable memory. This memory stores a predetermined number of recently generated codebook data DCB (to be described below) as original codebook data DCBO. This original codebook data DCBO is used for the decoding process as information to indicate the internal state of the decoder. The codebook decoder 18 is supplied with a codebook parameter PC included in the coded speech signal BS. The codebook decoder 18 takes the codebook parameter PC as an index, and outputs original codebook data DCBO stored in the memory area corresponding to this index in the above-described memory.

The preamplifier 19 amplifies the original codebook data DCBO at a gain corresponding to the gain parameter PG, and outputs the result as codebook data DCB.

The switch SW is a switch for switching the supply destination of the codebook data DCB outputted from the preamplifier, which supplies the codebook data DCB to the synthesis filter 17 when the above-mentioned switch control signal CSW has not been outputted, and outputs the codebook data DCB to the amplifier when the switch control signal CSW has been outputted.

When supplied with the codebook data DCB from the preamplifier 19 via the switch SW, the amplifier 16 amplifies the codebook data DCB by a predetermined amplification rate, and outputs the result as amplified codebook data DACB.

The synthesis filter 17 synthesizes a decoded speech signal SP from either the codebook data DCB or the amplified codebook data DACB (excited signal) and the synthesis parameter PSY. Additionally, of the codebook data DCB and the amplified codebook data DACB, the data (excited signal) inputted to the synthesis filter 17 is supplied to the above-mentioned codebook decoder 18 as new original codebook data DCBO. Then, the oldest of the original codebook data DCBO in the memory of the codebook decoder 18 is eliminated, and the new original codebook data DCBO is written into the memory.

Next, the amplification process control portion 12 comprises an error detecting portion 21A, a counter portion 22A and a switch control portion 23A.

The error detecting portion 21A detects frame errors of the coded speech signal BS and outputs an error detection signal SER.

The counter portion 22A counts successive frame errors based on the error detection signal SER, and outputs a count signal SCN. Specifically, this counter portion 22A increases the count value by "1" when an error detection signal SER is outputted in each frame period, and sets the count value "0" when an error detection signal SER is not outputted. Then, it outputs a count value as the count signal CN for each frame period.

The switch control portion 23A monitors the count signal SCN, and when the number of successive frame errors indicated by the count signal SCN exceeds the predetermined standard frame error number, then it subsequently outputs a switch control signal CSW for switching the switch SW to the amplifier 16 side for a predetermined number of frames after the frame errors have disappeared. Here, the switch control potion 23A senses that the succession of frame errors until then has ended upon the error detection signal SER no longer being outputted.

B. Operation of Embodiment

In the following description, the standard successive frame error number shall be "4". In a case where the number of error frames exceeds "4" in succession, the switch control portion 23A will output a switch control signal CSW for switching the switch SW to the amplifier 16 side from the start of the first error-free frame following immediately after the frame errors disappear for a time period equal to the length of one frame or the predetermined number of frames.

[1] When the Successive Frame Error Number is "4" or less.

In each frame period, original codebook data DCBO corresponding to the codebook parameter PC included in the coded speech signal BS is outputted from the codebook decoder 18 in the codebook data generation output portion 15. This original codebook data DCBO is amplified by a gain corresponding to the gain parameter PG by means of the preamplifier 19, and outputted as the codebook data DCB.

Here, the successive frame error number does not exceed the standard successive frame error number "4", so that the synthesis filter 17 is chosen by the switch SW as the supply destination of the codebook data DCB.

As a result, the codebook data DCB outputted from the preamplifier 19 is supplied through the switch SW to the synthesis filter 17. At the synthesis filter 17, a decoded speech signal SP is synthesized from codebook data DCB and the synthesis parameter PSY. Additionally, the codebook data DCB supplied to the synthesis filter 17 is written into the codebook decoder 18 as new original codebook data DCBO.

[2] When Successive Frame Errors Occur.

In this speech decoder 10, a concealment process to rapidly attenuate the decoded results is performed when a frame error occurs. When this concealment process continues over a plurality of frame periods, the original codebook data DCBO in the memory of the codebook decoder 18 gradually approaches "0". This concealment process is described, for example, in "Design and Description of CS-ACELP: A Toll Quality 8 kb/s Speech Coder", IEEE Trans. on Speech and Audio Processing, vol. 6, no. 2, March 1998.

[3] When the Successive Frame Error Number Exceeds "4" and the Frame Errors Subsequently disappear.

When these conditions are met, the switch control signal CSW is outputted from the switch control portion 23A, and the amplifier 16 is chosen by the switch SW as the supply destination of the codebook data DCB for a single frame period.

Since the original codebook data DCBO stored in the memory of the codebook decoder 18 is roughly "0", the size of the codebook data DCB obtained from the preamplifier 19 is slight.

However, this codebook data DCB is supplied through the switch SW to the amplifier 16, amplified at a predetermined amplification rate, and supplied to the synthesis filter portion 17 as amplified codebook data DACB, as well as being written into the memory of the codebook decoder 18 as new original codebook data DCBO.

In this way, even if the past internal state of the speech decoder 10, i.e. the original codebook data DCBO in the memory of the codebook decoder 18 becomes approximately zero due to successive frame errors, when the frame errors subsequently disappear, amplified codebook data DACB in accordance with the amplification rate of the amplifier 16 is obtained as the excited signal for a standard period of time.

C. Specific Application Examples

Next, a specific example wherein the present embodiment is applied to the speech decoder of a CODEC using a CS-ACELP (Conjugate-Structure Algebraic Code Excited Linear Prediction) type CODEC format which is a predictive coding format, shall be explained with reference to FIG. 2. This type of CS-ACELP format speech coder and speech decoder are described, for example, in Salam et al., "Design and Description of CS-ACELP: A Toll Quality 8 kb/s Speech Coder", IEEE Trans. on Speech and Audio Processing, vol. 6, no. 2, March 1998.

(1) Structure of Speech Decoder

Figure 2:
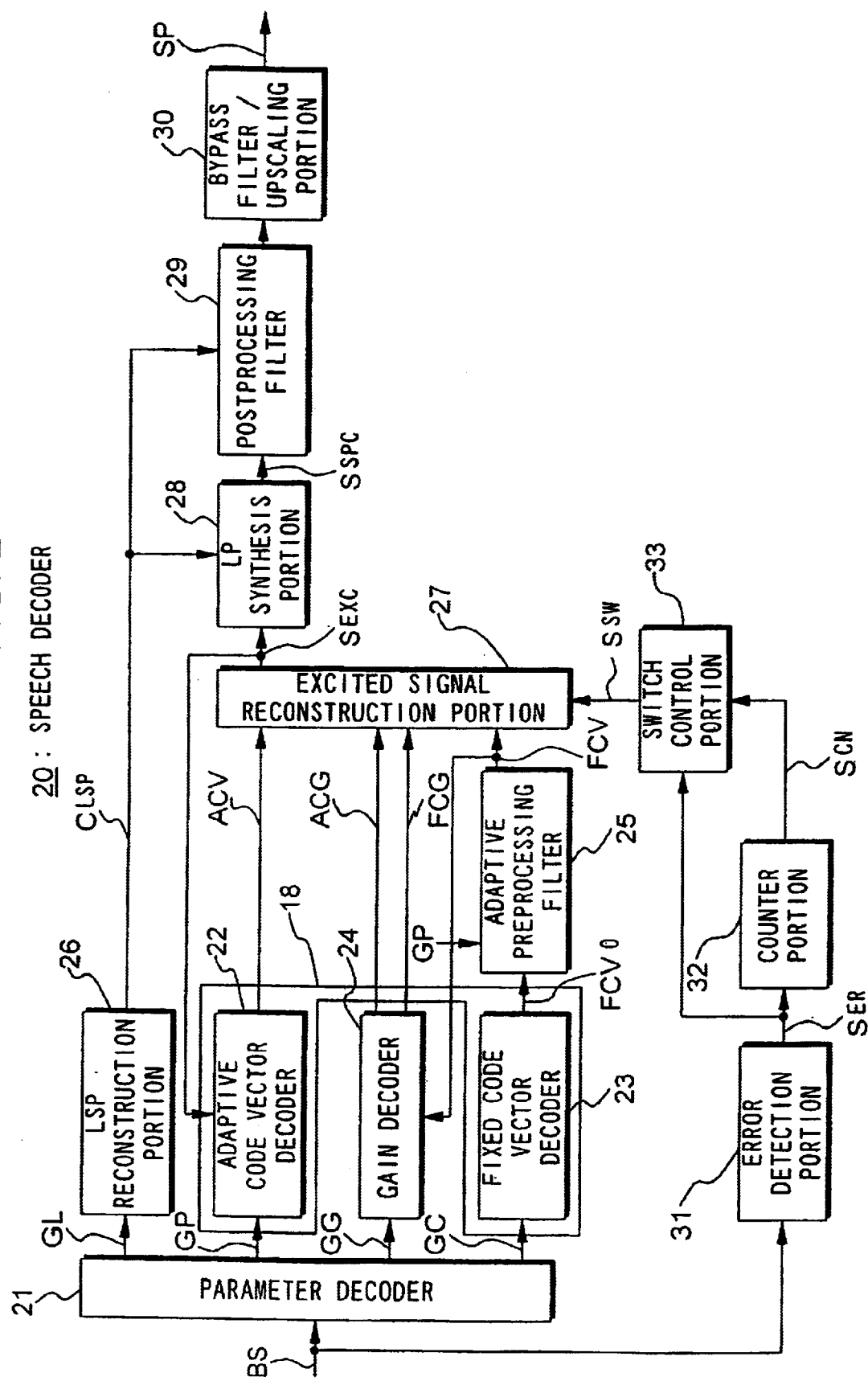
FIG. 2 is a block diagram showing an example of application of the same embodiment to a CELP decoder.

In FIG. 2, the speech decoder 20 has a parameter decoder 21. This parameter decoder 21 is a device for decoding a pitch delay parameter group GP, a codebook gain parameter group GG, a codebook index parameter group GC and an LSP (Line Spectrum Pair) index parameter group GL from the received coded speech signal (bitstream) BS.

Here, the codebook index parameter group GC contains a plurality of codebook index parameters and a plurality of codebook code parameters.

Additionally, the speech decoder 20 comprises an adaptive code vector decoder 22, a fixed code vector decoder 23 and an adaptive preprocessing filter 25.

Here, the adaptive code vector decoder 22 is a device for outputting an adaptive code vector ACV corresponding to the pitch delay parameter group GP. More specifically, this adaptive code vector decoder 22 has a rewritable memory, and this memory contains a predetermined number of adaptive code vectors ACV which have been input in the past. The adaptive code vector decoder 22 takes the pitch delay parameter group GP as an index, reads an adaptive code vector ACV corresponding to this index from the memory, and outputs the result. Additionally, when the excited signal SEXC is reconstructed by the excited signal reconstruction portion 27 to be described later, this excited signal SEXC is written into the memory of the adaptive code vector decoder 22 as a new adaptive code vector ACV, and the oldest adaptive code vector ACV in the memory is eliminated.

The fixed code vector decoder 23 is a device for outputting an original fixed code vector FCVO corresponding to the codebook index parameter group GC.

The adaptive code vector decoder 22 and the fixed code vector decoder 23 correspond to the codebook decoder 18 in FIG. 1.

The adaptive preprocessing filter 25 is a device which functions as an emphasizing process means for emphasizing the harmonic components of the decoded original fixed code vector FCVO, and outputs the result as a fixed code vector FCV.

Furthermore, the speech decoder 20 comprises a gain decoder 24 and an LSP reconstruction portion 26.

The gain decoder 24 is a device for outputting an adaptive codebook gain ACG and a fixed codebook gain FCG based on a fixed code vector FCV (or original fixed code vector FCVO) and a codebook gain parameter group GG.

The LSP reconstruction portion 26 is a device for reconstructing the LSP coefficient CLSP based on the LSP index parameter group GL.

Further, the speech decoder 20 comprises an excited signal reconstruction portion 27, an LP synthesis filter 28, a postprocessing filter 29 and a bypass filter/upscaling portion 30.

Here, the excited signal reconstruction portion 27 is a device for reconstructing the excited signal SEXC based on adaptive code vector ACV, an adaptive codebook gain ACG, a fixed codebook gain FCG and a fixed code vector FCV (or original fixed code vector FCVO). This excited signal SEXC is written into the memory of the adaptive code vector decoder 22 as a new adaptive code vector ACV, and the oldest adaptive code vector ACV in the memory is eliminated.

The LP synthesis filter 28 is a device which performs an LP synthesis based on the excited signal SEXC and the LSP coefficient CLSP to reconstruct the speech signal SSPC.

The postprocessing filter 29 is a device for performing postprocess filtering of the speech signal SSPC. This postprocessing filter 29 is constructed of three filters, a long-term postprocessing filter, a short-term postprocessing filter and a slope compensation filter. These three filters are serially connected in the order of long-term postprocessing filter to short-term postprocessing filter to slope compensation filter in the direction of input to output.

The bypass filter/upscaling portion 30 is a device for performing a bypass filtering process and an upscaling process with respect to the output signals of the postprocessing filter 29.

Additionally, the speech decoder 20 comprises an error detecting portion 31, a counter portion 32 and a switch control portion 33.

Here, the error detecting portion 31 is a device for detecting frame errors of the received coded speech signal BS and outputting the error detection signal SER.

Additionally, the counter portion 32 is a device for counting the successive frame error number based on the error detection signal SER and outputting a count signal SCN.

Furthermore, the switch control portion 33 is a device, after the successive frame error number indicated by the count signal SCN has exceeded a predetermined reference frame error number, outputting the switch control signal SSW for switching the below-described switch SW1 to the below-described third amplifier 44 (see FIG. 3) side until a predetermined number of frames after the frame errors disappear.

The error detecting portion 31, counter portion 32 and switch control portion 33 correspond to the error detecting portion 21A, counter portion 22A and switch control portion 23A in FIG. 1.

Figure 3:
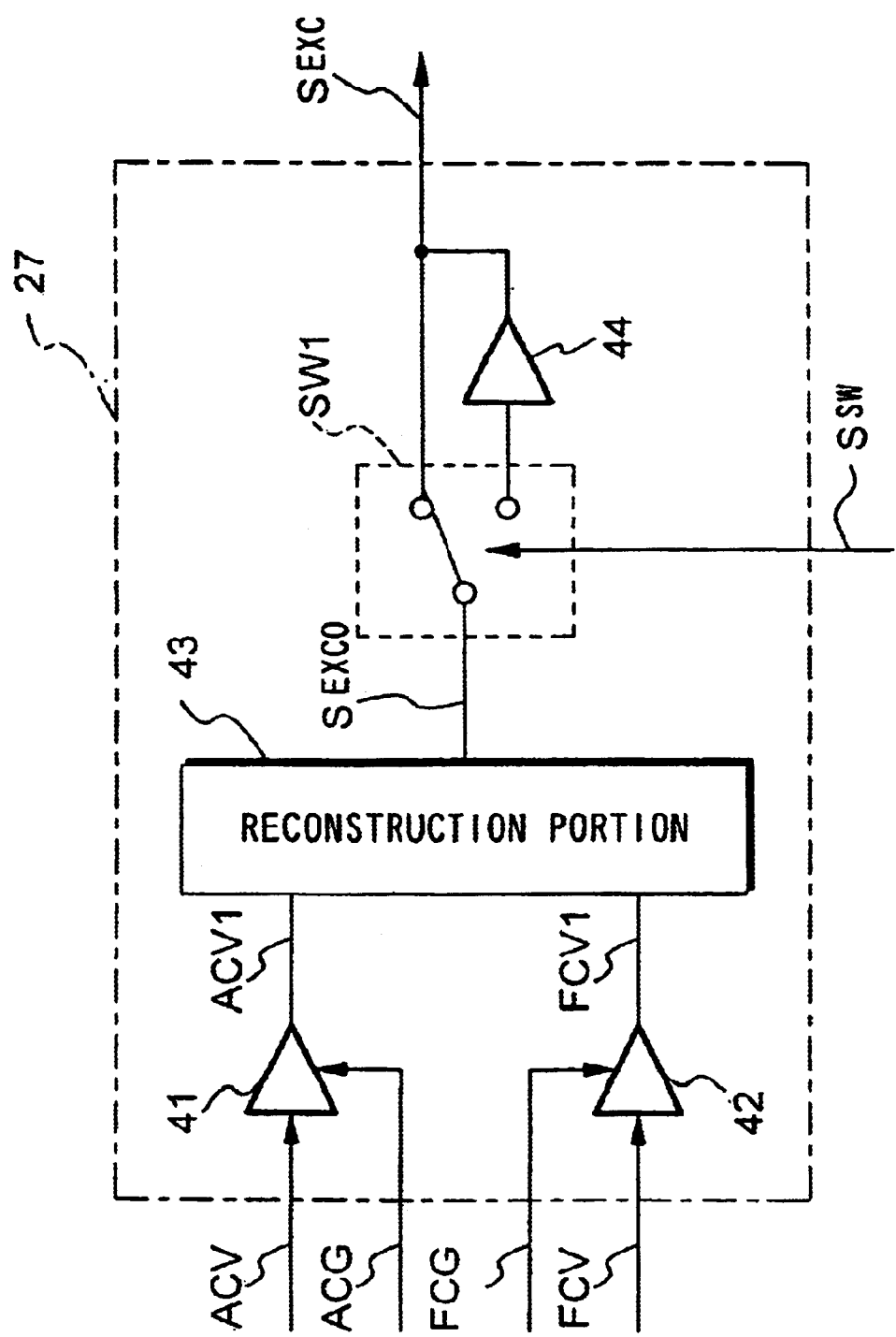
FIG. 3 is a block diagram showing the detailed structure of an excited signal reconstruction portion of the same CELP decoder.

FIG. 3 is a block diagram showing an example of the structure of an excited signal reconstruction portion 27.

As shown in FIG. 3, the excited signal reconstruction portion 27 comprises a first amplifier 41, a second amplifier 42, a reconstruction portion 43, a switch SW1 and a third amplifier 44.

Here, the first amplifier 41 outputs the adaptive code vector ACV amplified by a gain corresponding to the adaptive codebook gain ACG as an amplified adaptive code vector ACV1.

Additionally, the second amplifier 42 outputs the fixed code vector FCV amplified by a gain corresponding to the fixed codebook gain FCG as an amplified fixed code vector FCV1.

The reconstruction portion 43 reconstructs an original excited signal SEXCO based on the amplified adaptive code vector ACV1 and the amplified fixed code vector FCV1.

The switch SW1 outputs the original excited signal SEXCO to the LP synthesis filter 28 (Fid. 2) when a switch control signal SSW is not being outputted, and outputs the original excited signal SEXCO to the third amplifier 44 when the switch control signal SSW is being outputted.

The third amplifier 44 amplifies the original excited signal SEXCO and outputs the result to the LP synthesis filter 28 (FIG. 2) as an excited signal SEXC.

(2) Operation of Speech Decoder

Next, the operation of the speech decoder shall be explained.

In the following description, the reference successive frame error number shall be "4". Additionally, the switch control portion 33 outputs a switch control signal SSW for switching the switch SW1 to the third amplifier 44 side after the number of successive frames has exceeded "4", for one frame after the frame errors have subsequently disappeared.

[1] When continuous frame error number is "4" or less.

In FIG. 2, the parameter decoder decoeds a pitch delay parameter group GP, a codebook gain parameter group GG, a codebook index parameter group GC and an LSP (Line Spectrum Pair) index parameter group GL from the received coded speech signal (bitstream) BS.

Then, the parameter decoder 21 outputs the pitch delay parameter group GP obtained by decoding to the adaptive code vector decoder 22, outputs the codebook gain parameter group GG to the gain decoder 24, outputs the codebook index parameter group GC to the fixed code vector decoder 23 and outputs the LSP (Line Spectrum Pair) index parameter group GL to the LSP reconstruction portion 26.

The LSP reconstructing portion 26 reconstructs an LSP coefficient CLSP based on an LSP index parameter group GL, and outputs the result to the LP synthesis filter 28 and the postprocessing filter 29.

The adaptive code vector decoder 22 decodes the adaptive code vector ACV based on the pitch delay parameter group GP, and outputs the result to the excited signal reconstruction portion 27.

The fixed code vector decoder 23 decodes the original fixed code vector FCVO based on the codebook index parameter group GC, and outputs the result to the adaptive preprocessing filter 25.

The adaptive preprocessing filter 25 performs an emphasis process of emphasizing the harmonic components of the decoded original fixed code vector FCVO and outputs the results to the gain decoder 24 and the excited signal reconstruction portion 27 as a fixed code vector FCV.

The gain decoder 24 outputs the adaptive codebook gain ACG and fixed codebook gain FCG to the excited signal reconstruction portion 27 based on the fixed code vector FCV (or original fixed code vector FCVO) and the codebook gain parameter group GC.

In the excited signal reconstruction portion 27, the first amplifier 41 amplifies the adaptive code vector ACV with a gain corresponding to the adaptive codebook gain ACG, and outputs the result to the reconstruction portion 43 as an amplified adaptive code vector ACV1.

Additionally, the second amplifier 42 amplifies the fixed code vector FCV with a gain corresponding to the fixed codebook gain FCG, and outputs the result to the reconstruction portion 43 as an amplified fixed code vector FCV1.

The reconstruction portion 43 reconstructs the original excited signal SEXCO based on the amplified adaptive code vector SCV1 and the amplified fixed code vector FCV1, and outputs the result to the switch SW1.

Here, when the successive frame error number of the coded speech signal BS is less than the predetermined reference frame error number "4", the switch SW1 is set to the LP synthesis filter 28 side.

As a result, the original excited signal SEXCO is outputted to the LP synthesis filter 28 as the excited signal SEXC. Additionally, this excited signal SEXC is written into the memory of the adaptive code vector decoder 22 as a new adaptive code vector ACV, and the oldest adaptive code vector ACV in the memory is eliminated.

The LP synthesis filter 28 performs an LP synthesis based on the excited signal SEXC and the LSP coefficient CLSP to reconstruct the speech signal SSPC, then outputs the result to the postprocessing filter 29.

The postprocessing filter 29 performs postprocess filtering of the speech signal SSPC, then outputs the result to the bypass filter/upscaling portion 30.

The bypass filter/upscaling portion 30 performs a bypass filtering process and upscaling process on the inputted speech signal SSPC and outputs the result as a decoded speech signal SP.

When the successive frame error number is less than 4 in this way, i.e. when the state of reception of the coded speech signal BS is good, an excited signal SEXC of an appropriate level is written into the memory of the adaptive code vector decoder 22, whereby decoding is performed using the past excited signal SEXC written into the memory, so that a decoded speech signal SP having the optimum power is output.

[2] When Successive Frame Errors are Generated

When frame errors occur, a concealment process is performed for rapidly attenuating the decoded results. When this concealment process continues over a plurality of frame periods, the adaptive code vector ACV in the memory of the adaptive code vector decoder 22 gradually approaches "0". This concealment process is described in the document "Design and Description of CS-ACELP: A Toll Quality 8 kb/s Speech Coder", IEEE Trans. on Speech and Audio Processing, vol. 6, no. 2, March 1998.

[3] When the Successive Frame Error Number Exceeds "4" and the frame errors Subsequently Disappear.

In this case, the switch control portion 33 outputs a switch control signal SSW for switching the switch SW to the third amplifier 44 side one frame from the time the frame errors disappear.

As a result, the excited signal reconstruction portion 27 sends the original excited signal SEXCO outputted from the reconstruction portion 43 through the switch SW1 to the third amplifier 44.

Here, since the original excited signal SEXCO is that immediately after successive concealment processes have been performed, the level is slight. However, the excited signal SEXCO is amplified by the third amplifier 44, outputted to the LP synthesis filter 28 as an excited signal SEXC and is written into the memory of the adaptive code vector decoder 22 as a new adaptive code vector ACV.

For this reason, the past internal state of the speech decoder 20, i.e. the adaptive code vector ACV in the memory of the adaptive code vector decoder 22 is quickly restored to a normal state, and a decoded speech signal SP having a power approximately the same as the normal case is outputted.

Accordingly, the subjective sound quality of the decoded speech signal SO is raised in comparison to cases in which an amplification process is not performed.

D. Modifications of the Embodiment

While a case of a CS-ACELP type speech decoder was described as a specific example of a speech signal processing device in the above description, the present invention can be applied to speech signal processing devices of other formats such as speech decoders using APC (Adaptive Predictive Coding), LPC (Linear Prediction Coding), RELP (Residual Excited LPC) or CELP (Code Excited LPC), as long as they are speech signal processing devices which perform predictive coding.

What is claimed is:

1. A modified concealing device for a code-excited linear prediction (LP) decoder that generates excited signals based on frames of received signals and performs an error concealment process in which excited signals are attenuated when an error is found in a received LP signal frame comprising:

(a) a codebook that has a renewable internal state (t−1) according to which the codebook outputs, indexed by parameters in a received LP signal frame (t), a code vector which is processed into an excited signal vector (t), the excited signal vector being used to renew the internal state (t−1) of the codebook to an internal state (t), where t−1, t, . . . indicate discrete time series;

(b) an amplifier that amplifies the excited signal vector;

(c) a switch that selects either the excited signal vector (t) or the amplified excitation signal vector (t) from the amplifier and supplies it to the codebook for renewal of its internal state (t−1) to an internal state (t);

(d) a counter that counts a number of successive error frames that contain an error in received LP signals; and (e) a switch controller that directs the switch, if the number of successive error frames counted by the counter exceeds a predetermined number, to select amplified excitation signal vectors for a time period equal to a predetermined number of frames which time period begins from decoding of a first error-free frame after receiving the successive error frames, whereas otherwise directing the switch to select excitation signal vectors.

2. A modified concealing device according to claim 1, wherein the decoder decodes signals coded by a CELP type speech coder.

3. A modified concealing method for a code-excited linear prediction (LP) decoder. comprising steps of:

(a) receiving frames (t, t+1, . . . ) of linear prediction (LP) signals, where t, t+1, . . . are discrete time series;

(b) generating an excited signal vector (t) according to an internal state (t−1) in a codebook indexed by parameters in a received LP signal frame (t);

(c) renewing the internal state from the internal state (t−1) to an internal state (t), using the excited signal vector (t);

(d) checking if a frame (t) contains any errors and, if it does, attenuating the excited signal vector (t);

(e) checking if a number of successive error frames exceed a predetermined number; and (f) if the number of successive error frames exceeds the predetermined number, in place of the steps (c), renewing the internal state, using amplified excited signal vectors, for a time period equal to a predetermined number of frames which time period begins from decoding of a first error-free frame after receiving the successive error frames.

* * * * *

UNITED STATES PATENT AND TRADEMARK OFFICE
CERTIFICATE OF CORRECTION

PATENT NO. : 6,714,908 B1 Page 1 of 1
DATED : March 30, 2004
INVENTOR(S) : Nobuhiko Naka It is certified that error appears in the above-identified patent and that said Letters Patent is hereby corrected as shown below:

<u>Title page,</u>
Item [57], ABSTRACT,
Line 3, before "11" delete "potion" and substitute -- portion -- in its place.

<u>Column 9,</u>
Line 21, delete "decoder. comprising" and substitute -- decoder comprising the -- in its place; and <u>Column 10,</u>
Line 15, after "place of the" delete "steps" and substitute -- step -- in its place.

Signed and Sealed this

Twenty-second Day of March, 2005

JON W. DUDAS
*Director of the United States Patent and Trademark Office*